(12) United States Patent
Yee et al.

(10) Patent No.: US 7,351,611 B2
(45) Date of Patent: Apr. 1, 2008

(54) METHOD OF MAKING THE MOULD FOR ENCAPSULATING A LEADFRAME PACKAGE

(75) Inventors: Richard Mow Lum Yee, Perak (MY); Chee Heng Wong, Perak (MY); Chee Ching Yip, Perak (MY); Sasidharan Suresh Dass, Perak (MY); Kam Chuan Lau, Perak (MY); Kok Siang Goh, Perak (MY)

(73) Assignee: Carsem (M) Sdn Bhd, Perak (MY)

( * ) Notice: Subject to any disclaimer, the term of this patent is extended or adjusted under 35 U.S.C. 154(b) by 0 days.

(21) Appl. No.: 10/868,171

(22) Filed: Jun. 15, 2004

(65) Prior Publication Data

US 2005/0186711 A1 Aug. 25, 2005

(30) Foreign Application Priority Data

Feb. 20, 2004 (MY) .............................. PI 2004-0557

(51) Int. Cl.
*H01L 21/56* (2006.01)

(52) U.S. Cl. ...................... 438/112; 438/124; 438/127; 257/E33.066

(58) Field of Classification Search ................ 438/123, 438/124, 127, 112; 425/123
See application file for complete search history.

(56) References Cited

U.S. PATENT DOCUMENTS

| | | | |
|---|---|---|---|
| 5,328,870 A | 7/1994 | Marrs | |
| 5,623,162 A | 4/1997 | Kurihara | |
| 5,897,883 A | 4/1999 | Cho et al. | |
| 6,302,673 B1 * | 10/2001 | Frechette et al. | ............ 425/123 |
| 6,436,736 B1 * | 8/2002 | Embong et al. | ............ 438/125 |
| 6,521,468 B1 * | 2/2003 | Song et al. | ................... 438/15 |
| 6,627,976 B1 | 9/2003 | Chung et al. | |
| 6,645,794 B2 * | 11/2003 | Takahashi et al. | .......... 438/127 |
| 6,696,750 B1 * | 2/2004 | Yin et al. | ................... 257/675 |

\* cited by examiner

*Primary Examiner*—Thanh Nguyen
(74) *Attorney, Agent, or Firm*—Townsend and Townsend and Crew LLP

(57) ABSTRACT

A mould for encapsulating an integrated circuit package on a leadframe including a top mould-half and a complementary bottom mould-half enclosing a cavity for encapsulating said package wherein structures are provided on at least one of said mould-halves which, upon the closure of said mould-halves, closes off the spaces between adjacent leads of the leadframe to allow only said leads to extend out of said cavity. The structures may be protrusions from the mould half closing off the spaces. Notches or slots cut to allow the leads' extension are the preferred structures due to ease of machining. The mould design thus enables a leadframe package to be moulded with a peripheral flange as narrow as desired without the need to cut a broad conventional flange formed up to the dam bar because only the leads and tie bars are left to be singulated. A method for making the above mould as well as singulation methods for cutting and punching the leads and tie bars is also disclosed.

4 Claims, 8 Drawing Sheets

METHOD OF MAKING THE MOULD FOR ENCAPSULATING A LEADFRAME PACKAGE

FIELD OF INVENTION

This invention relates to a mould for encapsulating a leadframe package of an integrated circuit (IC). The mould is provided with features enabling the encapsulation of the IC into a desired package outline for the ease of singulation of the package from the leadframe. A method for machining such a mould, a package outline produced from the mould, and a process of singulating such a package from the leadframe are also disclosed.

BACKGROUND ART

An integrated circuit (IC) or semiconductor die may be packaged as a leadless package whereby the IC or die is first attached to a leadframe, followed by electrical interconnection established between the die and the leads of the leadframe, and the interconnected die is then encapsulated with plastic to a specific package outline before the packaged IC is singulated from the leadframe. The singulation process involves cutting to sever the leads, leaving external leads to protrude or pads exposed from the package as the electrical contact points for the IC. The singulation process may involve mechanical punch-and-die cutting means, sawing means, chemical etching or combinations thereof.

For a leadless package, the leads are cut as close as possible to the package body so that an outline or footprint as small as possible is obtained in order that the IC package occupies as little area as possible on a printed wiring board which population density is ever increasing due to demands of miniaturisation and compact product design. In this specification, the term "lead" may include tie bars and other like projections that extend out of the mould (during encapsulation) or the package (after encapsulation).

In the conventional encapsulation process, as shown in FIG. 1 (Prior Art) in plan view, the lead webbing of the leadframe (10) enables the interconnected die or IC to be held in accurate alignment within the moulding cavity (12) of the encapsulation mould which typically comprises a top mould-half and a complementary bottom mould-half. The closure of the mould-halves would still leave a gap at the parting line due to the leads extending from the moulding cavity. The gap enables the molten resin, which is injected into the cavity (12) via gate (13) to fill up the cavity (12), to overflow and seep out through the gap (thus forming flashes and bleeds) until it is stop by a dam bar (14) or rail (15) which extends traversing the leads (16) such as disclosed in U.S. Pat. No. 5,623,162 (NEC Corporation).

Upon curing of the resin and parting of the mould-halves, a broad flange (18) is formed around the package body (20) as shown in shadings in FIG. 2 (Prior Art). The broad flange has a thickness similar to the gap due to the leadframe's thickness. The next step is nicking to provide cut lines (22) as close as possible to the package body (20) to form the perimeter of the package outline so that the resultant singulated package has a base or bottom outline as small as possible. Cutting through the broad flange (18) in the singulation process thus involves cutting through both the resin layer and the leads in a single shearing action. The singulated package is shown in FIG. 3 (which is also the object of the moulding of our present invention). Due to the aforesaid demands of small package outline, the shearing close to the package body often results in a higher percentage of package rejects due to chipping, cracking or delamination defects as a result of the high stress of cutting through the leads and the moulded resin between the leads. Also mentioned in this NEC patent (at col. 6 lines 33-36) is the factor played by the moulding deviation order in the resin encapsulating and curing steps (e.g. in the order of 0.05 mm) that will result in the lead protrusion in a certain range of tolerance (i.e. 0-0.25 mm for the above example).

As such it would be desirable to design a mould which could limit the overflow or seepage of the resin through the gap in between the mould-halves' parting line due to the leads' (16) extension out of the moulding cavity (12). Preferably, the resin flow is limited to the cutting line so that only the leads (16) and tie bars (17) need to be cut during singulation. In this manner, the shearing close to the package body will only need to cut through the leads, i.e. without the moulded resin between the leads. There may be a number of patents on the method or devices for stopping, limiting or controlling the flow of molten resin out of the mould during encapsulation—however, we have not been able to find any that limits the resin flow by providing modifications to the mould to achieve this object. The following is representative of the various patents on methods and devices which are different from our invention.

U.S. Pat. No. 5,328,870 (Amkor Electronics) discloses a mould design with a dimensional mismatch between a heat sink's thickness and the corresponding mould cavity, so that the encapsulant is prevented from forming on the exposed heat sink surface. This technique is not applicable in our case as it is designed for encapsulating and affixing a heat sink to the top of the package.

U.S. Pat. No. 5,897,883 (Samsung Electronics) discloses modifications to the mould cavity that are thought to reduce the difference between the shear velocities at the edges and at the centre of the cavity. The modifications comprise providing continuous projections (261) along the lower edges of the bottom mould-half in the flow of the resin. Various profiles of the projection (261, 261a, 261b) are disclosed, including one which may be inserted as a separate projection block (261c). These projections are provided within the surfaces of the mould cavity to control the encapsulant sweep or flow and are not designed for stopping the resin flow at the periphery of the package as in our invention.

U.S. Pat. No. 6,627,976 (Amkor Technology) discloses a mould design whereby a gate and multiple exit vents for the resin flow are provided. They are formed by sills (48) which project downwardly from the upper mould-half. The sills (48) are formed on the mould upper half's lower surface and is a continuous structure along the dam bars and rail of the leadframe except for the corners of the package where exit vents are provided. The sills serve to narrow down the resin flow path into the mould cavity and therefore correspond to the function of a gate in addition to the mould gate (152), and as well as at the vents (154, 156 and 158). The resin will only stop at the dam bar as in conventional methods and the resultant package thus has a broad flange which requires cutting to size.

STATEMENT OF DISCLOSURE

It is an object of the present invention to provide a mould design which could limit the overflow or seepage of the resin through the gap in between the mould-halves' parting line due to the leads extending out of the moulding cavity. The effective stopping of the resin flow would enable a flangeless or a flange as narrow as possible to be moulded along the periphery of the leadframe package so that only the leads and tie bars are left to be cut in the subsequent singulation process.

Consequentially, further objects of the invention includes providing for (i) a process for machining a mould into the desirable design, (ii) a process for the encapsulation and singulation the leadframe package into one having a peripheral flange as close as possible to the package body.

To achieve a leadframe package without a peripheral flange or with a peripheral flange as narrow as possible as shown in FIG. 3, as a general embodiment, the present invention discloses a mould for encapsulating an integrated circuit package on a leadframe comprising a top mould-half and a complementary bottom mould-half enclosing a cavity for encapsulating said package wherein structures are provided on at least one of said mould-halves which, upon the closure of said mould, substantially closes off the spaces between adjacent leads to prevent encapsulant from flowing out of said cavity.

In one preferred embodiment, the structures are protrusions are provided on at least one of the top and bottom mould-halves to substantially close off the spaces between adjacent leads to prevent the encapsulant from flowing out of the cavity. Protrusions may also be complementarily provided on both mould-halves in which the combined protrusion height provides the clearance for the leads' to extend out of the cavity.

In another preferred embodiment, the structures are notches provided on at least one of the top and bottom mould-halves complementary to the leads' positions to enable said leads to extend out of the cavity. The notches may be complementarily provided on both mould-halves in which, upon the closure of the mould-halves, the combined cut-out height on the closed mould-halves provides the clearance for the leads to extend out of the cavity.

In yet another preferred embodiment, a relief is provided along the periphery of the mould cavity to provide for a complementary peripheral flange defining the footprint of an integrated circuit package formed therefrom. The flange so formed may be between 0.05 mm-0.20 mm from the package body and a thickness of about the same or less than ($\leq$) the thickness of the leadframe. Preferably, the flange formed has rounded corners and a side wall having a minimum draft angle of 0°. The mould is preferably provided with a gate having thickness not exceed the leadframe thickness.

In a second aspect of the invention, a method for making a mould for encapsulating an integrated circuit package on a leadframe is disclosed wherein the method comprises closing the mould, which comprises a top mould-half and a complementary bottom mould-half, to form a cavity for encapsulating the package while substantially closing off the spaces between adjacent leads of the leadframe to allow only said leads to extend out of the cavity, and providing protrusions between the adjacent leads to substantially close off the spaces on at least one of said mould-half.

As an alternative to protrusions, the method may comprise of providing notches complementarily provided on at least one of the a mould-half to enable said leads to extend out of the cavity while the spaces between adjacent leads are closed off.

Preferably, a sharp corner between the flange and package side walls is provided by electro-discharge machining process comprising the steps of:

(i) machining the encapsulation cavity, follow by (ii) machining the flange relief.

As preferred embodiments, the machining additionally reduces mould land length at the corners to reduce drag during encapsulation.

In a third aspect of the invention, a method is provided for singulating a leadframe package having a flange around the package base comprising using the flange as a guide for cutting the singulation line around said package. Preferably, the punching uses a punch provided with precision pilot guide means to singulate the package within 0.02 mm from the flange edge. The punching may preferably results in a lead protrusion of between 0 to 0.025 mm from the flange edge.

Other preferred steps of the singulation process includes punching to result in a burr up cut edge of the leads and the results in a flange which side wall has a minimum draft angle of 0°.

LIST OF ACCOMPANYING DRAWINGS

The present invention will be better understood with reference to the accompanying drawings (apart from FIGS. 1 to 2 (Prior Art) discussed above) and the detailed description that follows wherein specific embodiments are described as non-limiting examples or illustration, in which.

DETAILED DESCRIPTION OF SPECIFIC EMBODIMENTS

Figure 1:
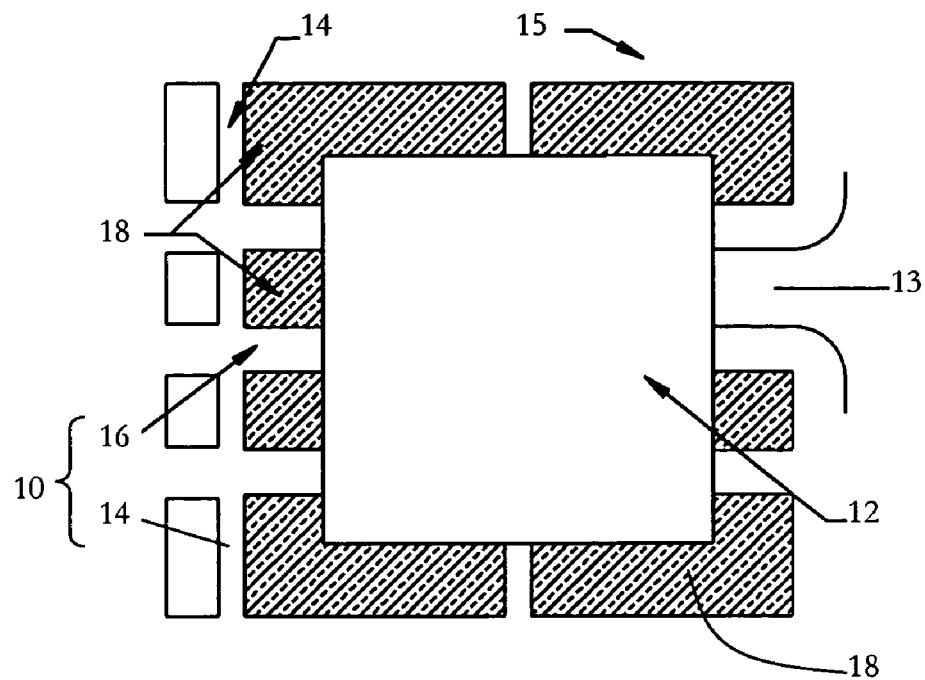
FIG. 1 (Prior Art) shows a schematic plan view of a leadframe package with the peripheral flange formed with the encapsulant filling the spaces between the leads in a conventional encapsulation.
Figure 2:
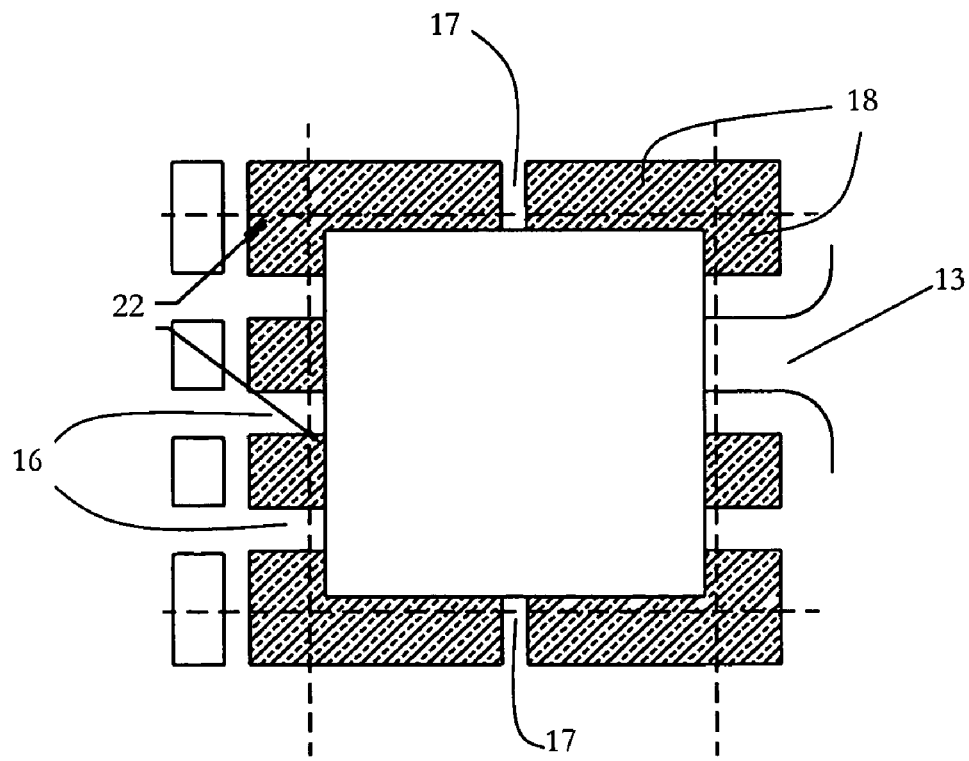
FIG. 2 (Prior Art) shows a schematic plan view of a leadframe package of FIG. 1 with the singulation lines for trimming the peripheral flange.
Figure 3:
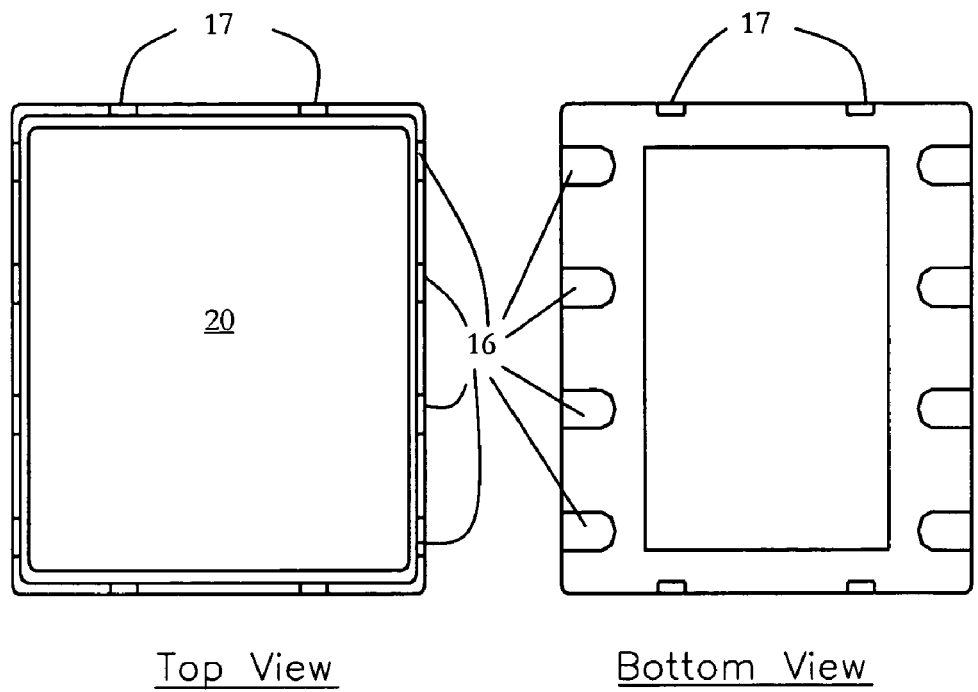
FIG. 3 shows the top and bottom views of a leadless leadframe package with a desirable narrow peripheral flange.

The desired leadless leadframe package, as shown in FIG. 3, may be produced according to the present invention in which a trim or narrow flange (28) is formed around the periphery of the package body (20) after the cutting off the leads (16) and tie bars (17) from the leadframe (10).

In the first aspect of the present invention, as a general embodiment, a mould is provided for encapsulating an integrated circuit package on a leadframe. The mould may comprise of a top mould-half and a complementary bottom mould-half which may be mutually closed upon each other to enclose a cavity for encapsulating an integrated circuit (IC) or semiconductor die therein. The IC or die may preferably have been interconnected to the leadframe. The general inventive concept lies in providing structures on either one or both of the mould-halves which, upon the closure of said mould, closes off the spaces between the adjacent leads of the leadframe to allow only said leads to extend out of said cavity and prevent the encapsulant from flowing out. Such means may be conceptually bifurcated into "positive" or "negative" structures provided on the mould-half.

A positive structure generally covers any form of protrusion piece or block that may be inserted or attached, either in a removable or permanent manner, to the mould so that the space in between the adjacent leads are blocked thereby preventing the molten resin from seeping out from the gaps that remains as the two mould-halves are clamped together for the encapsulation process.

A negative structure generally covers any form of cut, notch, depression or indentation into the mould so that only the leads may extend out of the cavity via said notches while the uncut portions keep the resin from flowing out during encapsulation. Accordingly, the word "structure" is intended in this specification to cover both the positive and negative structures which are effective in keeping the spaces between the leads and tie bars blocked to prevent resin flow from seeping through the gaps due to the leadframe thickness upon the closure of the mould-halves.

As shown in FIGS. 4 and 4A-4E (wherein FIGS. 4A-4E show the various combinations of positive and negative structures on either or both mould-halves whereby the IC package is shown in a "live-bug" orientation), the positive structures may be provided as blocks of protrusion or projection (30) which may be attached to the mould-half—in this case, the top mould-half (19a), as an insert or block. The alternative to protrusions, i.e. negative structure on the other hand, may be provided as notches (32) cut out from a peripheral lip (34) provided on the mould-half (19a) so that they become slots for the leads (16) or tie bars (17) to extend out from the cavity (12) when the IC- or die-mounted leadframe is placed on the mould for encapsulation process.

It will be appreciated that although it may be possible to tool the protrusion blocks (30) to be affixed as multiple inserts into holes drilled onto that part of the mould defining the periphery of the package, it may not be economical to do so in addition to the difficulty in assembling them onto the mould to correspond to the spaces between the leads which are to be blocked. Other possible ways of providing for the protrusion blocks which may not be economically feasible presently includes providing durable material with sufficient thickness to form a block of protrusion by coating, soldering, electro-deposition, sputtering and like methods whereby the deposition of material may be accurately controlled (e.g. based on number of layers or coatings) and accurately placed to form the protrusion block (30) of sufficient thickness. For durability, the material selected must be able to withstand the heat and pressure of the moulding process. It may also be possible to provide the protrusion on both mould-halves so that upon the closing of the mould-halves, the protrusions on each of the mould-halves complement each other to form the protrusion of the desired shape and thickness.

The negative structure may be provided as a notch or slot (32) cut into a peripheral lip (34) of a mould-half. The positions of the notches (32) correspond to the leads (16) and tie bars (17) positions so that these structures of the leadframe may extend out of the moulding cavity (12). As with the positive structures, the depth of the notches that is cut may be distributed between the two mould-halves so that upon the closing of the mould-halves, the notches or cuts on each of the mould-halves (19a, 19b) complement each other to form the slot of the desired position and depth to enable the leads (16) and tie bars (17) to extend out of the cavity (12).

Figure 4:
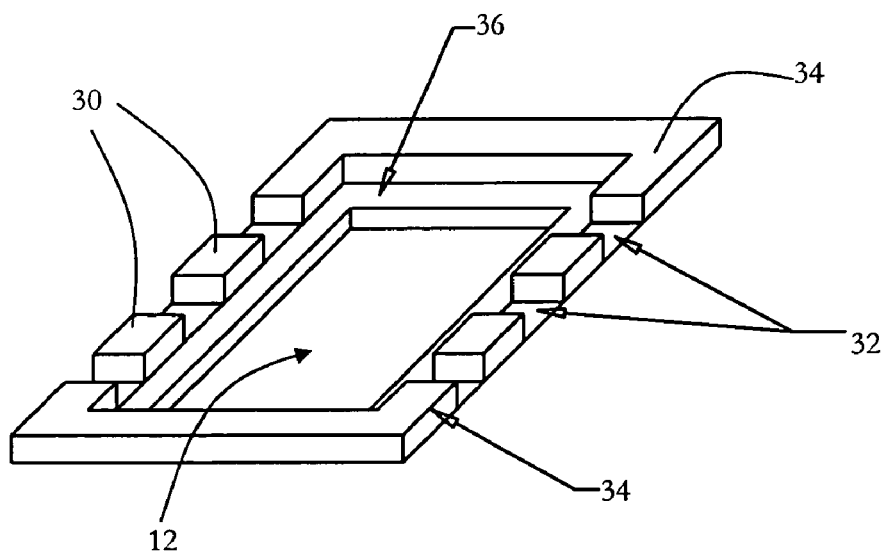
FIG. 4 shows the top mould-half of the invention's mould in downside up position in perspective view.
Figure 4A:
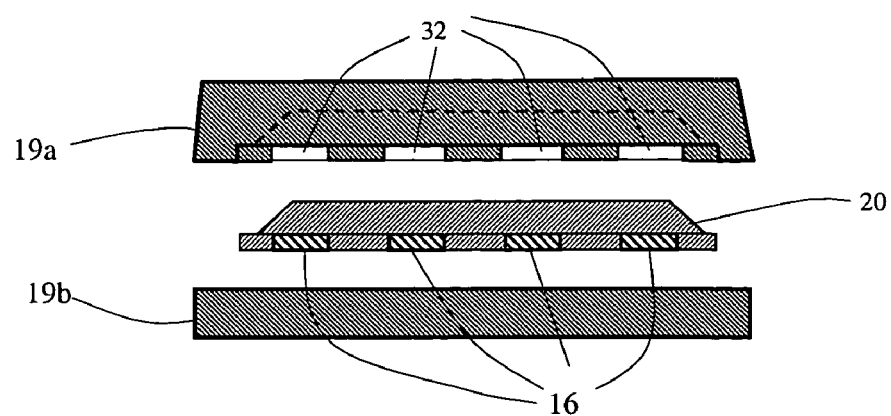
FIGS. 4A-4E show various structures according to the invention on either or both mould-halves.
Figure 4B:
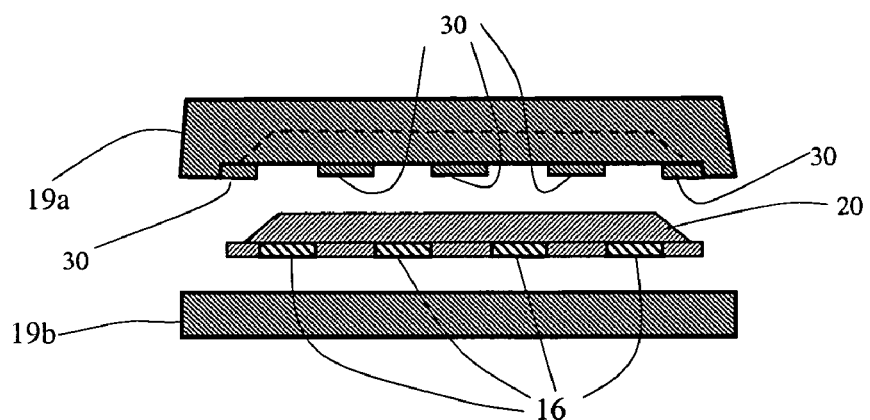
Figure 4C:
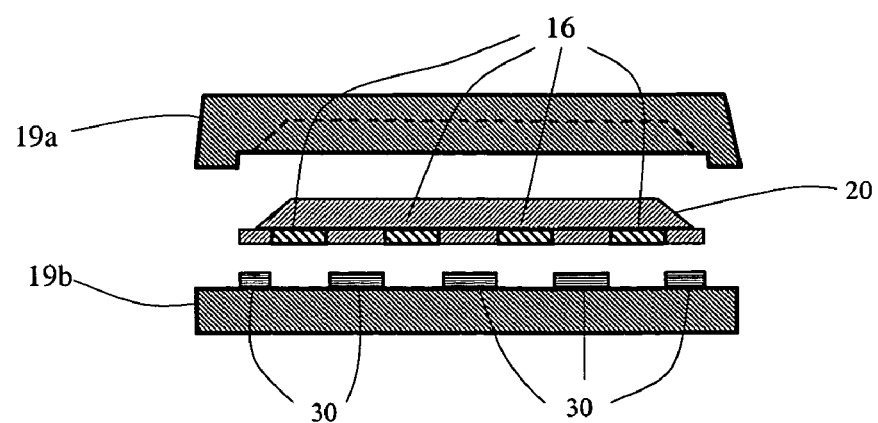
Figure 4D:
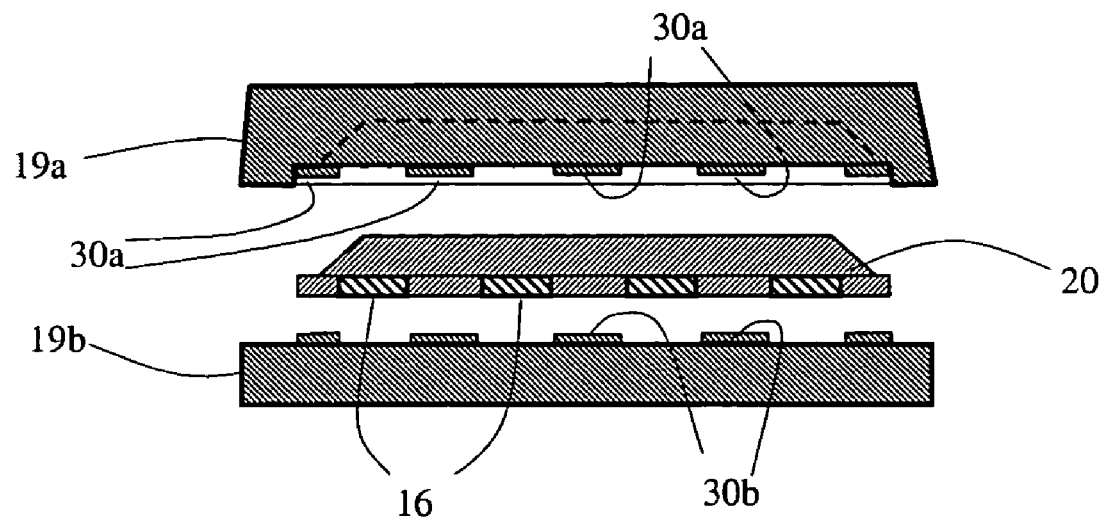
Figure 4E:
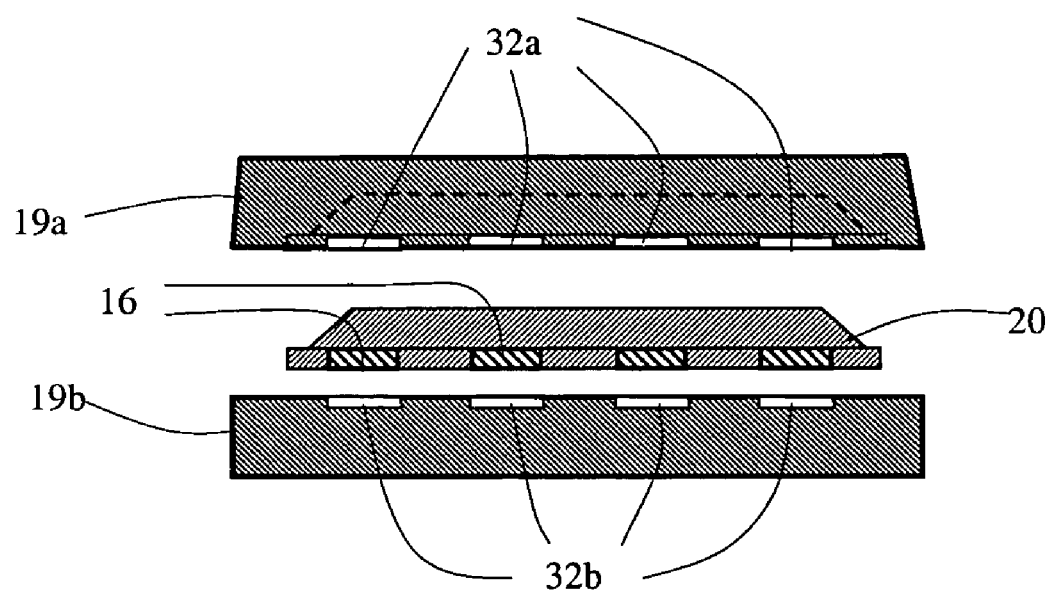
Figure 5:
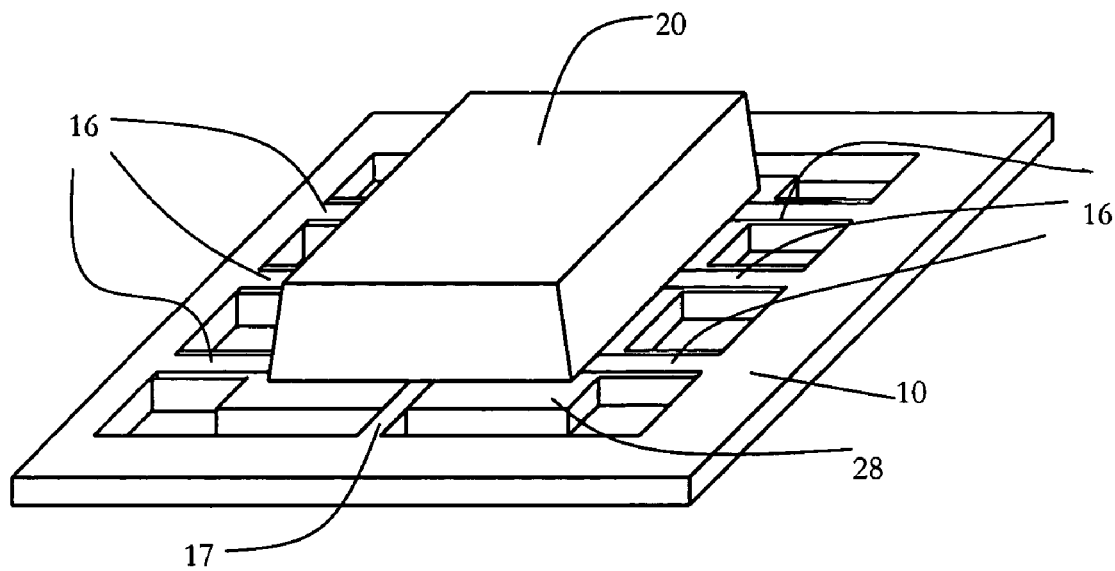
FIG. 5 shows the perspective view of a moulded package according to the invention which is still attached to its leadframe.

The cutting of the notches for the leads and tie bar extension may be accurately provided by conventional precision grinding, electro-discharge machining (EDM) and other techniques available. To achieve the periphery of the leadless package having an all-round flange (28), the top mould-half may be provide with a corresponding and complementary all-around relief (36) as shown in FIG. 4. The result of the encapsulation in a mould according to our invention is a moulded package still attached to the leadframe (10) wherein a narrow peripheral flange (28) is produced as a result of the relief (36) as shown in FIG. 5. Preferably, the flange (28) so formed has a breath of between 0.05-0.20 mm from the package body (20). The exact breath form would, however, depend on the moulding deviation or tolerance as explained in the Background Art section above while discussing U.S. Pat. No. 5,623,162 (NEC). Preferably, the moulding deviation or mould accuracy does not exceed the 40-micron limit in order to achieve the flange having the aforesaid breath in the range of 0.05-0.20 mm, even after the package thickness has been reduced by de-flashing process.

Preferably, the mould according to the present invention does not produce a flange thickness which is more than the thickness of the leadframe. Similarly, the gate (13) thickness should not be more than the leadframe thickness. Another preferred feature of the flange is to have rounded corners. A preferred feature of the side wall is having a draft angle of 0° or more. These features are considered important in preventing chipping, cracking or delamination of the moulding due to the stress from the singulation of the package from the leadframe.

Figure 6:
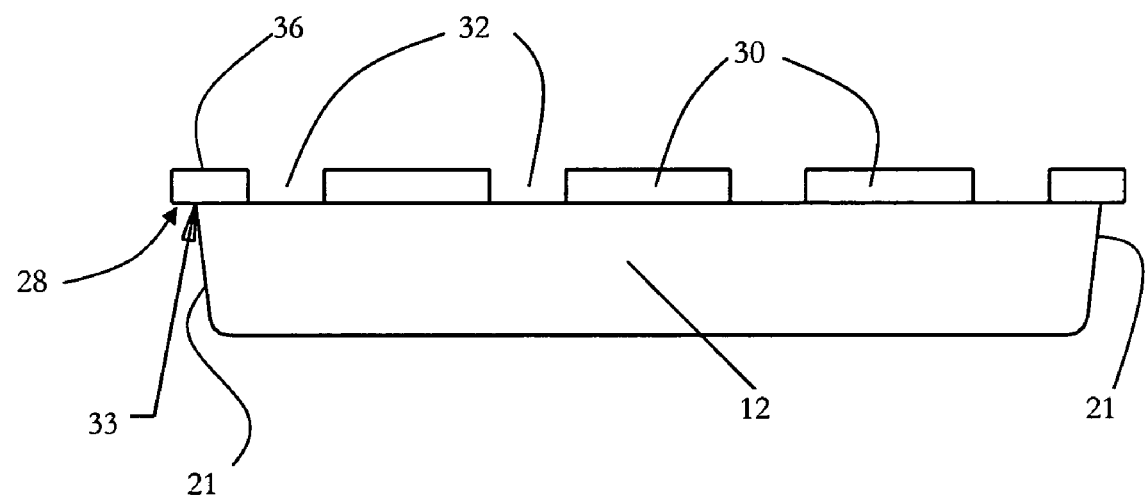
FIG. 6 shows a schematic elevation view of the mould according to the invention.

FIG. 6 shows a schematic elevation view of the mould according to the invention wherein is shown a sharp corner (33) formed between the flange (28) and the package side wall (21). To form the sharp corner (33), a two-step EDM process is employed whereby the encapsulation cavity (12) is first machined, followed by machining the flange relief (36). Optionally, as in conventional moulding, to produce moulded corners that are sharp, the mould's corresponding surfaces meeting to form the corner may be tooled to reduce the land length so that drag of the resin flow may be reduced during encapsulation.

Singulation

In another aspect of the invention, a method is disclosed for singulating a leadframe package having a flange around the package body wherein the flange serves as a guide for cutting a singulating line around the package periphery. The singulation procedure may be divided into two separate cutting processes, i.e. the lead cutting process which is followed by the tie bar cutting process.

Lead Cutting

Figure 7:
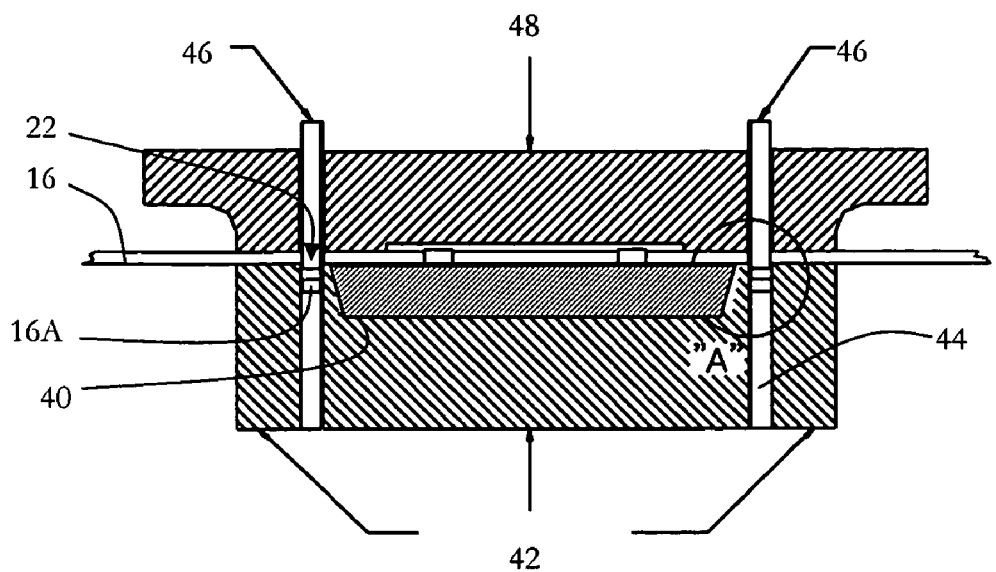
FIG. 7 shows the elevation view in cross-section of the punching of leads.
Figure 7A:
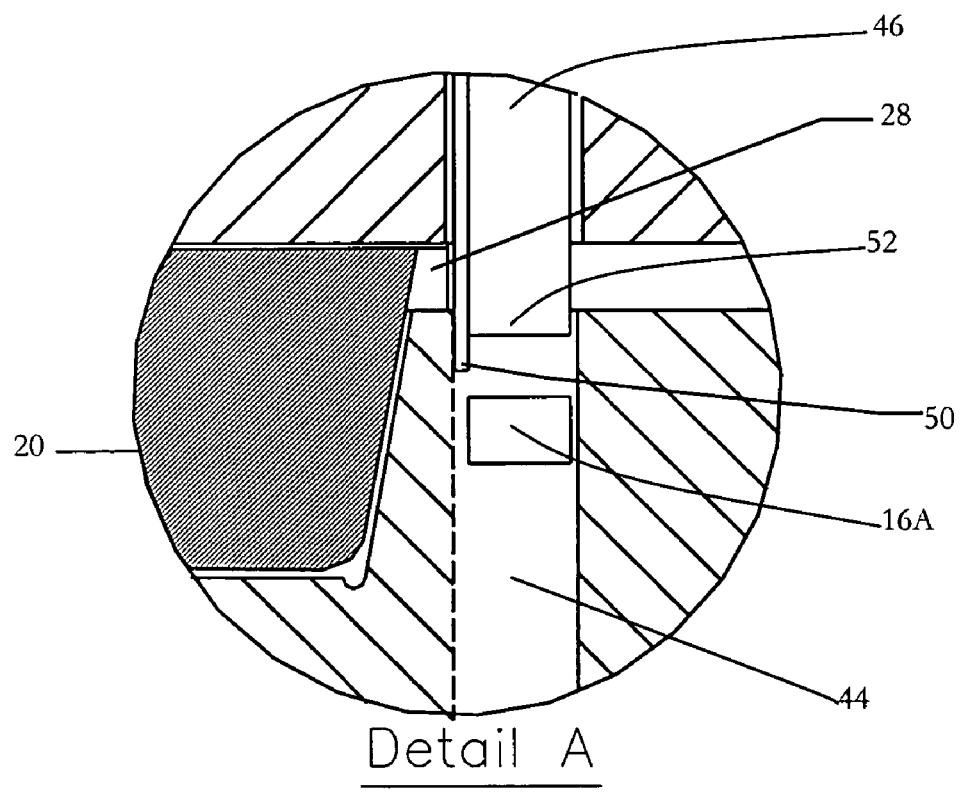
FIG. 7A shows in detail the elevation view in cross-section of area "A" of FIG. 7.

FIG. 7 shows the elevation view in cross-section of the punching of leads wherein the area marked "A" is shown in detail in FIG. 7A. The encapsulated leadframe package (40) is shown placed in a "dead bug" position (i.e. with the top surface of the package body inverted or upside down) on a die insert (42) which is provided with slug reliefs (44) so that the remnants (16A) of the leads (16) that is cut away by the lead cutting punches (46) may be disposed away. Stripper (48) is placed atop the package (40) which has been carefully aligned accurately in the X-Y plane so that the singulation lines (22) are accurately aligned with the lead cutting punches (46). The stripper (48) then securely clamps down on the leadframe and the lead cutting punches (46) moves down to sever the leads (16) along the singulation lines (22).

FIG. 7A shows in detail the punching action of the punches (46) wherein is shown a pilot guide means (50) being provided at the inner side of the punch tip (52) to lead the latter. As discussed above, the moulding deviation factor will result in the lead protrusion within a certain range. For example, a moulding deviation in the order of 0.05 mm may result in a lead protrusion in the range of 0 mm-0.25 mm. To offset the moulding deviation, the pilot guide (50) is used to bring the lead cutting punch (46) to reach the lead (16) at the singulation point (22) by guiding the punch (46) to be as close as possible to the package body (40) edge and yet away from the moulded flange (28) in order to cut the lead (16).

With the pilot guide means, the punch is cleared from cutting into the moulded flange (28) and the entire punching action used to sever the lead (16) only and thus avoided stressing the edges of the package which is faced when cutting out the moulded flange in conventional method. As a result, we are able to bring the lead cutting punch (46) to be within 0.02 mm from the moulded flange (28). The pilot guide (50) is preferably in one piece or integral with the lead cutting punch (46).

Figure 8:
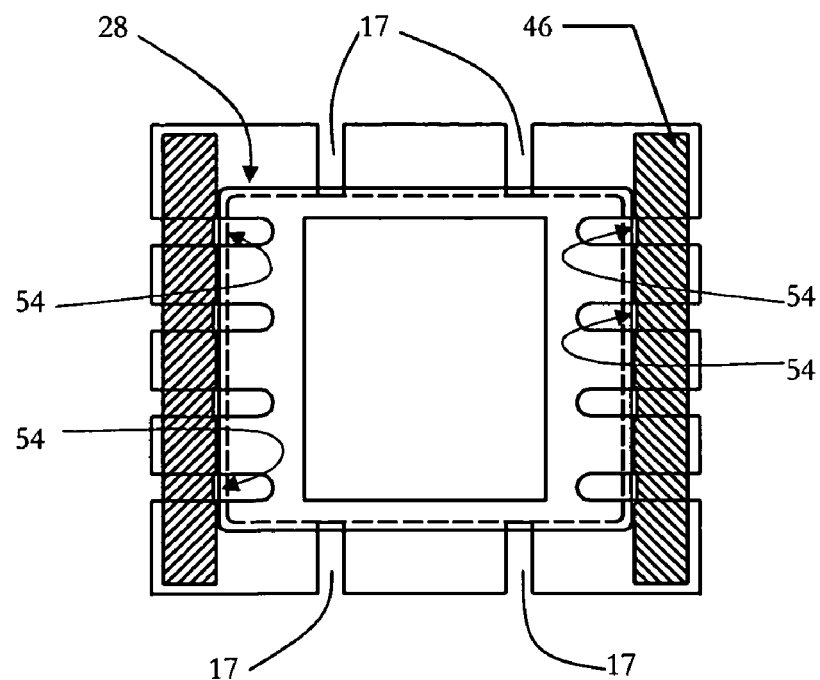
FIG. 8 shows a plan view of the punch-and-die arrangement.

FIG. 8 shows a schematic plan view of the punch-and-die arrangement wherein is shown the lead cutting punch (46) being provided with offsets (54) to protect against cutting the moulded flange at between adjacent leads (16) so that the inner side of the punch (46) appears to be corrugated.

Tie Bar Cutting

Figure 9:
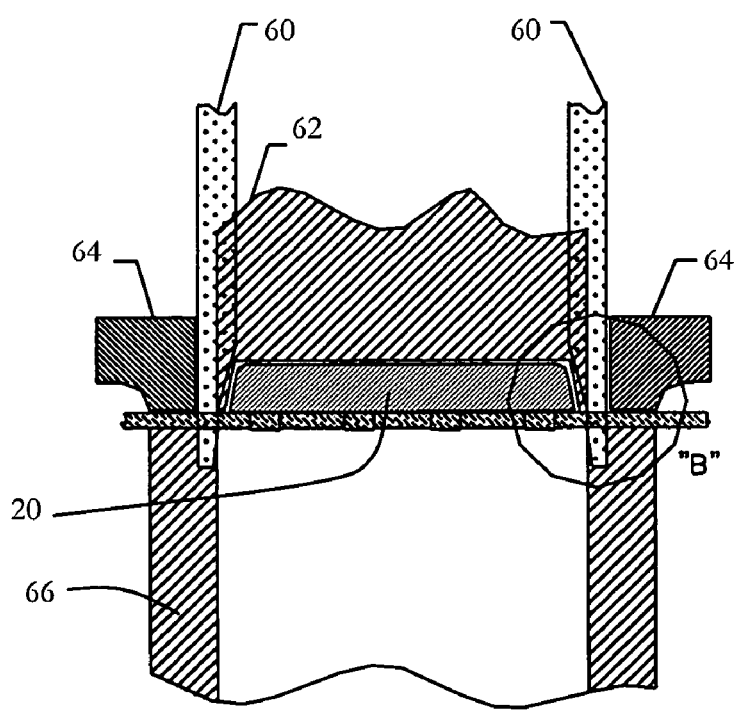
FIG. 9 shows the elevation view in cross-section of the punching of the tie bars.

The second step in the singulation process involves cutting the tie bars (17), i.e. the last linkages of the encapsulated package to the leadframe (10) upon the successful cutting of the leads (16). FIG. 9 shows the cross-sectional elevation view of the punching of the tie bars (17) wherein the package (20) is now held in a "live bug" position on die insert (66) held from the top by stripper (64). Precision guide bars (60) are used to guide the singulating punch (62) to move downwards in shearing the package (20) free from leadframe at the tie bars (17).

Figure 9A:
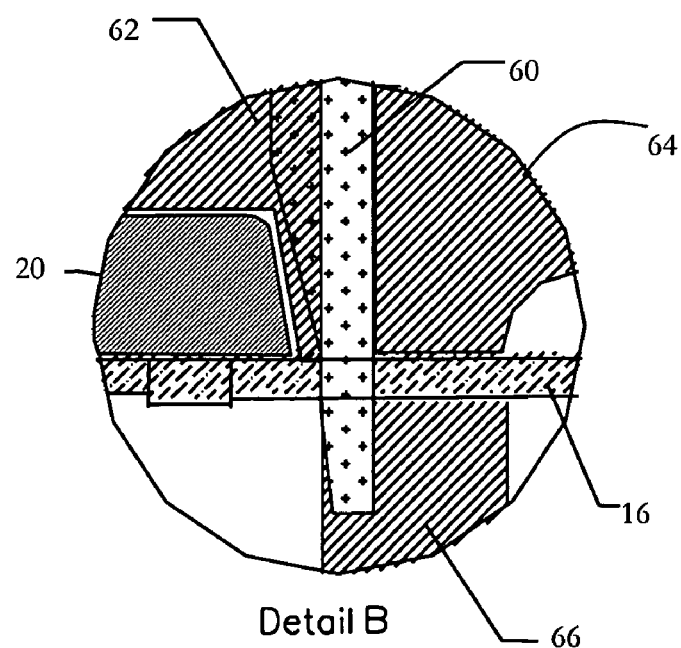
FIG. 9A shows in detail the elevation view in cross-section of area "B" of FIG. 9.
Figure 10:
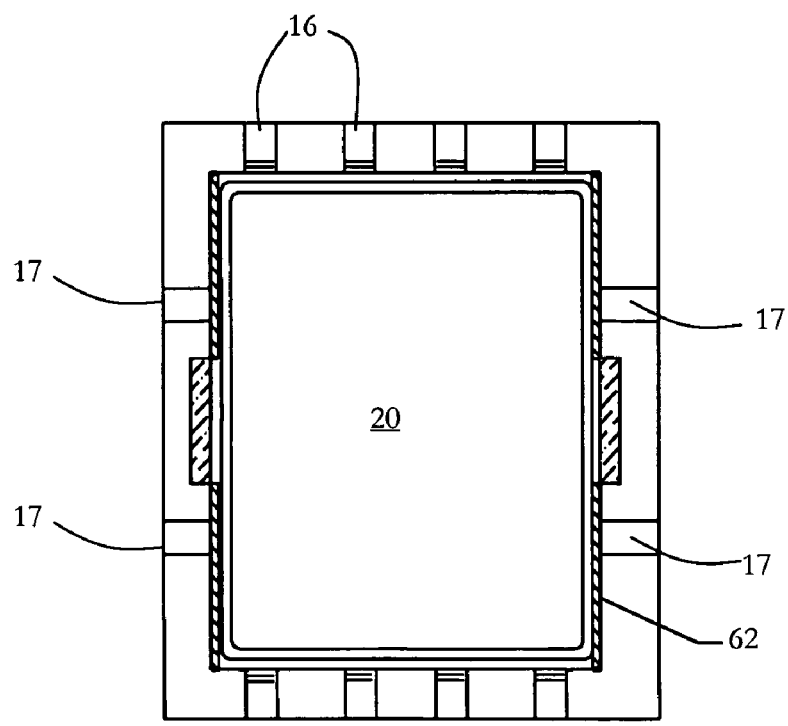
FIG. 10 shows a plan view of the guided punching of the tie bars.

FIG. 9A shows in detail the elevation view in cross-section of area "B" of FIG. 9 while FIG. 10 shows a schematic plan view of the guided punching of the tie bars (17). The tie-bar punching process also adopts a precision guiding means in the form of flange guide bars (60) wherein a tapering on the inside of the guide bar's tip (i.e. side adjacent the package) coincide with the draft angle of the package body so that the singulating punch (62) is accurately centred to punch at the tie bars (17) away from the package edge (28) on either sides of the package's moulded flange to avoid cutting into the flange edge (28).

We have found that with this arrangement the singulation process results in far fewer percentages of packages being chipped, cracked or delaminated. The various arrangement of the package—whether in live or dead bug positions—coincides with the particular punch-and-die arrangement whereby the cutting and punching should preferably result in a burr up cut edge of the leads.

As the leadframe package obtained with the mould of the present invention may be provided with a peripheral flange as narrow as possible, leaving only the metal parts, i.e. leads and tie bars, to be singulated, it is possible to adopt methods whereby the cutting of singulation lines and singulation punch includes techniques of reducing the flexural rigidity of the leadframe as disclosed in our co-pending Malaysian Patent Application No. PI 2004-0165.

The design of the package outline or profile may also assist in guiding or piloting the lead cutting and tie bar cutting punches in trimming and notching the leads and tie bars as close as possible to the package edge. For example, a package outline may have two draft angles, namely—a first draft angle at the base portion substantially at the lead frame level, and a second draft angle at the portion above said base portion covering substantially the remaining portion of the side of the package body, wherein the second draft angle is preferably larger than the first draft angle. A preferred package outline has the first draft angle in the range of 2°-4° and the second draft angle in the range of 8°-10°.

Other features include having a package edge that is rounded but preferably not more than 0.10 mm in radius so that electron or electrical discharge machining (EDM) technology may be used to tool the inserts, spacers, package pushers or strippers, etc. Preferably, the moulding is performed within a deviation of 40 μm even after the package thickness has been reduced by deflashing process.

While the example shown in the drawings is a dual in-line package (DIP), this invention is applicable to SIP (single in-line package), ZIP (zigzag in-line package), SOP (small outline package), QFP (Quad Flat Package), etc. where the use of lead frame packaging results in leads protruding out of any one or more of the package side or edge which requires trimming down the leads to very short remnants that approaches the physical dimensions of a leadless package.

From the above description on the general concept, features and working principles of the invention and its specific embodiments, it would be obvious to a person skilled in the art that there are many variations and alternative embodiments that may be used in substitution of the aforesaid parts, materials, steps or processes. Many of the various parts, components, materials and alternative configurations or embodiments that are not specifically described herein may be used to effectively work the concept and working principles of this invention. They are not to be considered as departures from the present invention but shall be considered as falling within the letter and scope of the following claims.

We claim:

1. A method of encapsulating an integrated circuit package, the method comprising:
    attaching an integrated circuit die having a plurality of bonding pads formed thereon to a lead frame having a plurality of leads;
    electrically connecting at least some of the leads to at least some of the bond pads;
    encasing the integrated circuit die and at least a portion of the lead frame within a cavity of a mould comprising a mould top portion having a relief and a mould bottom portion, the mould top and bottom portions shaped such that when joined together to encase the integrated circuit die, the mould substantially closes spaces between adjacent leads of the lead frame while allowing the leads to extend out of the cavity, and the relief produces a narrow peripheral moulded flange when filled with a resin that supports the integrated circuit die, wherein the formed peripheral moulded flange includes a narrow flat surface which supports the integrated circuit die along the peripheral edge of the integrated circuit die and wherein the peripheral moulded flange includes an opening that is surrounded by the peripheral moulded flange and wherein the opening does not provide support to some portion of the integrated circuit die;

introducing the resin into the cavity to encapsulate the integrated circuit die;

clamping down the lead frame; and separating the encapsulated integrated circuit die from the lead frame by severing the leads with a punch that is cleared from cutting into a moulded flange by a guide so that the entire punching action is used to sever the lead only and avoids stressing the edges of the integrated circuit die.

2. The method of claim 1 wherein the integrated circuit die is attached to a lead frame die pad that is integrally connected to an outer frame of the lead frame by a plurality of tie bars.

3. The method of claim 2 wherein the mould substantially prevents resin injected into the cavity during the injecting step from flowing out of the cavity between adjacent leads.

4. The method of claim 1 wherein the top portion of the mould includes a plurality of stepped structures positioned and sized such that when the top mould portion is engaged with the bottom mould portion to encase an integrated circuit die, each stepped structure projects towards the bottom mould portion into a space between adjacent leads to substantially close the space.

* * * * *